(12) United States Patent
Tsuji et al.

(10) Patent No.: US 6,305,976 B1
(45) Date of Patent: *Oct. 23, 2001

(54) ELECTRICAL CONNECTOR WITH PLANAR MOUNTING MEMBERS

(75) Inventors: Junya Tsuji, Kanagawa; Takashi Futatsugi, Tokyo, both of (JP)

(73) Assignee: AMP (Japan), Ltd., Kanagawa (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/545,640

(22) Filed: Apr. 7, 2000

(51) Int. Cl.[7] .................................................. H01R 13/60
(52) U.S. Cl. ........................... 439/570; 439/566; 439/108
(58) Field of Search .................................. 439/570–572, 439/108, 80–83, 567, 566

(56) References Cited

U.S. PATENT DOCUMENTS

| | | | |
|---|---|---|---|
| 4,693,528 | * | 9/1987 | Asick et al. ............................. 439/83 |
| 4,826,442 | * | 5/1989 | Douty et al. ............................. 439/92 |
| 4,969,829 | * | 11/1990 | Sato ....................................... 439/83 |
| 5,080,611 | * | 1/1992 | Hypes ................................... 439/567 |
| 5,096,440 | * | 3/1992 | Katsumuta ............................ 439/570 |
| 5,184,963 | * | 2/1993 | Ishikawa ................................ 439/79 |
| 5,549,481 | * | 8/1996 | Morlion et al. ....................... 439/108 |

OTHER PUBLICATIONS

Japanese laid–open utility model application Hei 5–23429, Mar. 1993.

* cited by examiner

*Primary Examiner*—Brian Sircus
*Assistant Examiner*—Son V. Nguyen

(57) ABSTRACT

An electrical connector (1) for circuit board installation is provided using solder pegs (60) to reduce the mounting area. Mounting holes (40) for insertion of solder pegs (60) are provided, along the side walls (36), on both sides of the housing (2) of the electrical connector (1) to be installed on a circuit board (30). The mounting holes (40) are formed perpendicular to the circuit board (30), from the top wall (18) of the housing (2) toward the bottom wall (34). The mounting holes (40) are connected to the mating aperture (6) of the connector (1), and are opened to the outside via the bottom part of the side walls (36). When the solder pegs (60) are inserted into the mounting holes (40) and the connectors are mated, a mating connector is guided by a solder peg face (61) of the solder pegs (60). The mounting holes (40) are connected by solder to the circuit board (30) at the tip (62a), and the tips (62a) of the solder pegs (60) serve as solder connection parts which can be visually inspected from the outside via the opening.

5 Claims, 4 Drawing Sheets

ELECTRICAL CONNECTOR WITH PLANAR MOUNTING MEMBERS

FIELD OF THE INVENTION

This invention concerns an electrical connector, and in particular an electrical connector for installation on circuit boards.

BACKGROUND OF THE INVENTION

The electrical connectors for installation on circuit boards of the prior art have, in the case of small electrical connectors, been fixed in place on the circuit board by soldering the contact tines to conducting pads of the circuit board. However, in the case of large connectors, or when it is desired to increase the installation strength, a separate solder peg is provided on the electrical connector. By soldering this solder peg onto the circuit board, the installation strength is increased. As one example of this, FIG. 9 is a cross-sectional diagram of a surface-mounted connector disclosed in Japanese laid-open utility model application Hei5-23429. This surface mounted connector 100 has slots 104 on both ends of its insulating housing 102, and in these slots 104 is inserted and fixed in place a metal fastener 106 with an L-shaped cross-section. The soldering part 108 of the fastener 106 extends in a lateral direction of the insulating housing 102; with this part it is soldered onto the circuit board (not shown) and fixed in place. Confirmation of the satisfactory state of this soldering is performed by visual inspection from outside of this extended soldering part 108.

In the case of the electrical connector 100 disclosed in laid-open utility model application Hei5-23429 which is an example of the prior art, the width of the electrical connector 100 is large, and moreover the fastener 106 extends in a lateral direction and requires a large mounting area.

SUMMARY OF THE INVENTION

The present invention was devised in light of the above problem. An object of the present invention is to provide an electrical connector having a housing size which can be reduced, and the mounting area for which is small when installed on a circuit board.

Another objective of the invention is to provide an electrical connector which, while having a small housing width, can guide the other connector during mating.

Still another objective of the invention is to provide an electrical connector such that, when fixing in place by soldering to the circuit board, the state of the soldering can be confirmed, and moreover repair of the soldering part is also possible.

The electrical connector of the present invention has multiple contacts, a housing to retain said contacts, and solder pegs to solder and fix into place said housing on a circuit board. The housing has mounting holes on both sides of said housing for vertical insertion and fixing of the solder pegs onto the circuit board, and the solder pegs are formed in an approximately planar shape. The solder pegs are soldered and fixed in place on the circuit board at a fracture plane of the tip of the solder peg.

Vertical insertion and fixing in place with respect to the circuit board also includes cases of insertion and fixing in place with some degree of inclination, in which the angle is not exactly 90° with respect to the circuit board.

Moreover, the mounting holes of the electrical connector of this invention may be linked with the mating aperture of the housing to accept a mating connector, and one surface of the solder pegs which is inserted and fixed into place in the mounting holes may be approximately in the same plane as a side wall delineating the mating aperture.

Further, the mounting holes of the electrical connector of this invention may be opened to the outside in proximity to the circuit board on which the connector is mounted.

The housing of the electrical connector of this invention has mounting holes on both sides for the vertical insertion and fixing in place of solder pegs with respect to the circuit board. The solder pegs have an approximately planar shape, and are soldered and fixed in place on the circuit board at a fracture plane of the tip of the solder peg, so that the width of the housing in the solder peg arrangement direction can be reduced. Further, soldering to the circuit board is performed only in the extremely small surface area of the pegs, so that there is the added advantage that the area occupied on the circuit board when mounting can be reduced.

The mounting holes are linked to the aperture of the housing for mating with the other connector, and one surface of the solder pegs inserted into and fixed in place in the mounting holes is in the same plane as a side wall delineating the mating aperture, so that the size of the electrical connector can be reduced, and in addition when the mating connector has been accepted in the mating aperture, the mating connector can be guided.

Also, the mounting holes are opened to the outside in the proximity of the circuit board on which the connector is mounted, so that the installed state of the soldered solder pegs can be visually inspected from outside to prevent the occurrence of defective items, and when soldering is inadequate, a soldering iron can be used from outside to repair the soldering part. Further, there is the advantage that, if the need arises to remove the electrical connector from the circuit board, similarly a soldering iron can be applied from outside to the soldering part, to melt the solder and remove the connector.

BRIEF DESCRIPTION OF THE DRAWINGS

The invention will now be described by way of example with reference to the following drawings, in which.

DETAILED DESCRIPTION OF THE INVENTION

Figure 1:
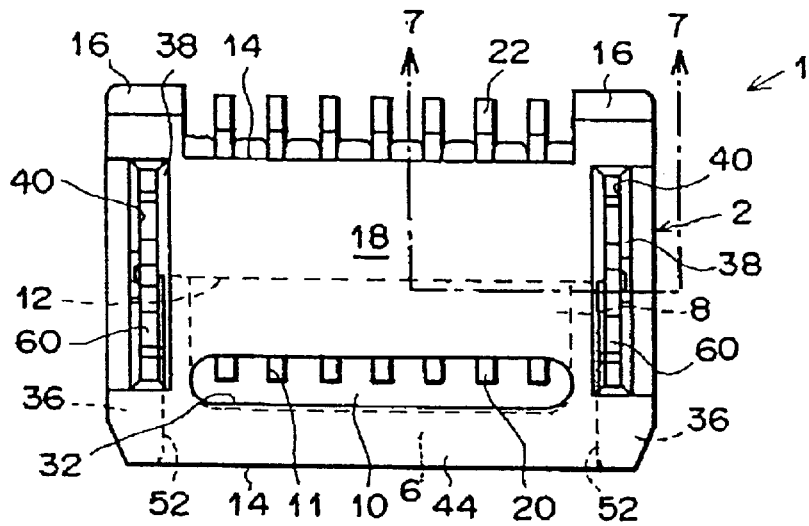
FIG. 1 shows a plan view of an electrical connector of the present invention.

As shown in FIGS. 1–4, a housing 2 is formed integrally from an insulating resin, and has a mating face 4 in the forward direction. In this mating face 4 is formed a mating aperture 6 to accept a mating connector (not shown). The mating aperture 6 is formed in the width direction by side walls 36, and includes a concave part 8 extending toward the inside of the housing 2. In this concave part 8 is provided a protruding center rib 10 of plate shape, facing the mating face 4 from the base 12 of the concave part 8. The center rib 10 extends horizontally similarly to the mating aperture 6, which is long horizontally, and is positioned approximately at the center of the mating aperture 6.

Figure 2:
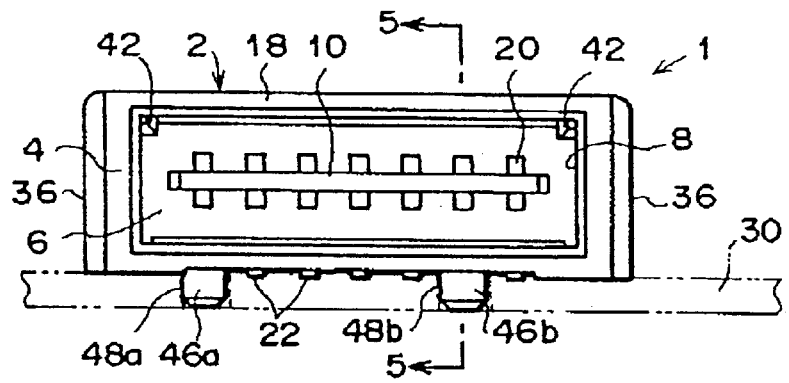
FIG. 2 is a front view of the electrical connector of FIG. 1.

Multiple contacts 20 are arranged at specific interfaces on this center rib 10. The details of the state of installation of the contacts 20 are described below. These contacts 20 are arranged such that they are in electrical contact with the mating contacts (not shown) at the time of mating with the mating connector. The back part of the contacts 20 is configured as a tine 22 protruding from the back end 14 of the housing 2 and connected to the circuit board 30 (FIG. 2). Within the mating aperture 6, key ribs 42 are formed in two places in the corner parts on the side of the upper wall 18, extending in the front-back direction of the connector 1, that is, in the direction of mating connector insertion and removal. The key ribs 42 provide keying in the mating of connectors, and prevent mistaken alignment.

On both sides of the back part of the housing 2 protrude protective walls in the back direction, protecting the tines 22 positioned between them. In the top wall 18 of the housing 2, in proximity to the mating face 4, is formed a long penetrating hole 32 extending in the horizontal direction (FIG. 1). This long hole 32 is used for locking when mating with a mating connector. In other words, on the outer walls of the mating connector inserted into the concave part 8, is formed a protrusion in the part corresponding to the long hole 32, configured so that they engage each other. The front edge part 44 of the upper wall 18, is configured so as to be pushed upward in elastic deformation momentarily by the above-described protrusion when the mating connector is inserted, and when mating is completed it returns so as to prevent release of the protrusion. By means of the engagement of this long hole 32 and the protrusion, the two connectors are locked.

Figure 3:
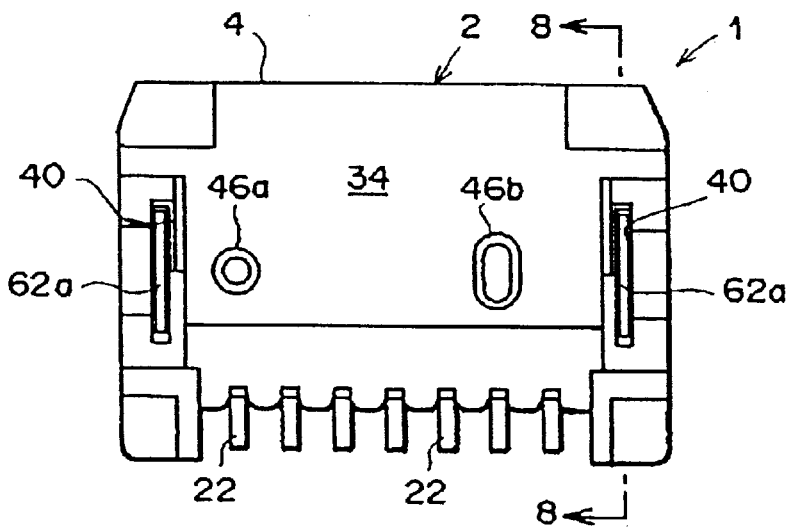
FIG. 3 is a bottom view of the electrical connector of FIG. 1.

Mounting holes 40 are formed in both ends of the housing 2 from the top wall 18 toward the bottom wall 34, along the side walls 36 (FIG. 1, FIG. 3). The solder pegs 60 described below are inserted into and fixed in place in these mounting holes 40, and become members for fastening to the circuit board. The mounting holes 40 have a long narrow shape extending from the end part of the housing 2 to near the mating face 4. On the perimeter of the side of the upper wall 18 of the mounting holes 40 are formed chamfers 38 to facilitate insertion of the solder pegs 60.

As shown most clearly in FIG. 3, two bosses 46a, 46b with different shapes protrude from the bottom wall of the housing 2. The boss 46a has a circular shape, and the boss 46b has a columnar shape with an approximately elliptical cross-section. These bosses 46a, 46b are respectively inserted into the corresponding complementary-shaped penetrating holes 48a, 48b of the circuit board 30 for mounting. These bosses position the connector 1, and prevent misalignment by keeping the housing 2 from being installed in the opposite orientation.

Figure 4:
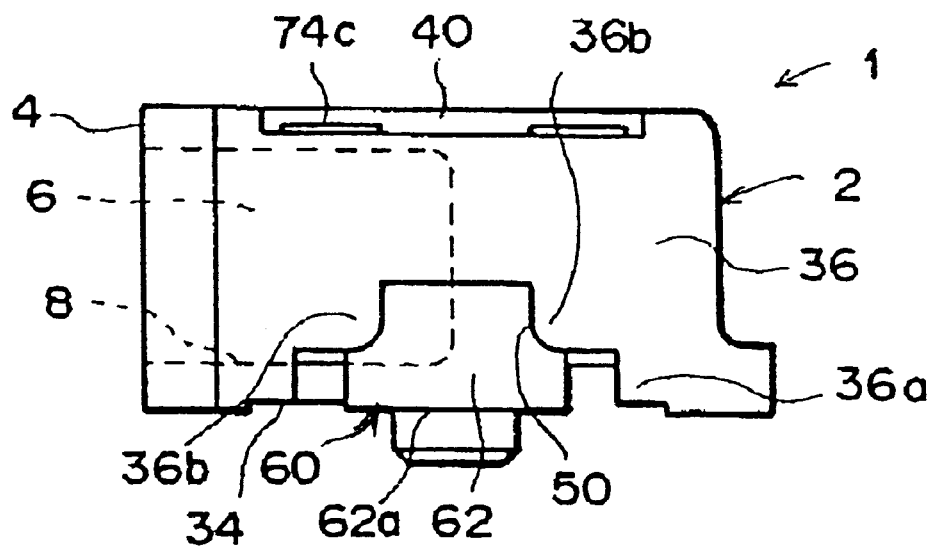
FIG. 4 is a side view of the electrical connector of FIG. 1.

As shown in FIG. 4, a cutout 50 is formed near the circuit board 30 in each side wall 36. These cutouts 50 extend to the bottom wall 34, and are linked with the mating aperture 6. In this manner, the mounting holes 40 are opened to the outside near the circuit board 30, that is, opened on the outer side of the side walls 36. After the solder pegs 60 are inserted, the mounting holes 40 are blocked by the inserted solder pegs 60, and so there is no concern of dust or other material penetrating into the mating aperture 6 from outside. In FIG. 4, it can be seen that the pressed faces 74c (FIG. 6) and the lower part 62 of the inserted solder pegs 60 are exposed. Soldering to the circuit board 30 is performed by soldering the tips 62a of the solder pegs 60 to the tops of metal pads, not shown, of the circuit board 30.

The cutouts 50 are widely opened at the bottom edge parts 36a of the side walls 36, and after passing through a transition part 36b are opened with narrow width near the center part of the side walls 36. By means of these shapes, the bottom parts 62 of the solder pegs 60 can be exposed to the outside as much as possible, while supporting in the lower direction as far as possible the solder pegs 60 by means of the transition parts 36b to stably retain the solder pegs 60.

By exposing to the outside the tips 62a of the solder pegs 60, that is, the soldering parts, it is possible to confirm by visual inspection from outside the state of adhesion of solder after soldering. When soldering is inadequate, a soldering iron or other tool (not shown) can be applied to the vicinity of the tip part 62a of the solder pegs 60 from outside, to perform repairs. Also, when the need arises to replace the connector 1, the tool described above can be used to melt the solder and remove the connector 1.

Figure 5:
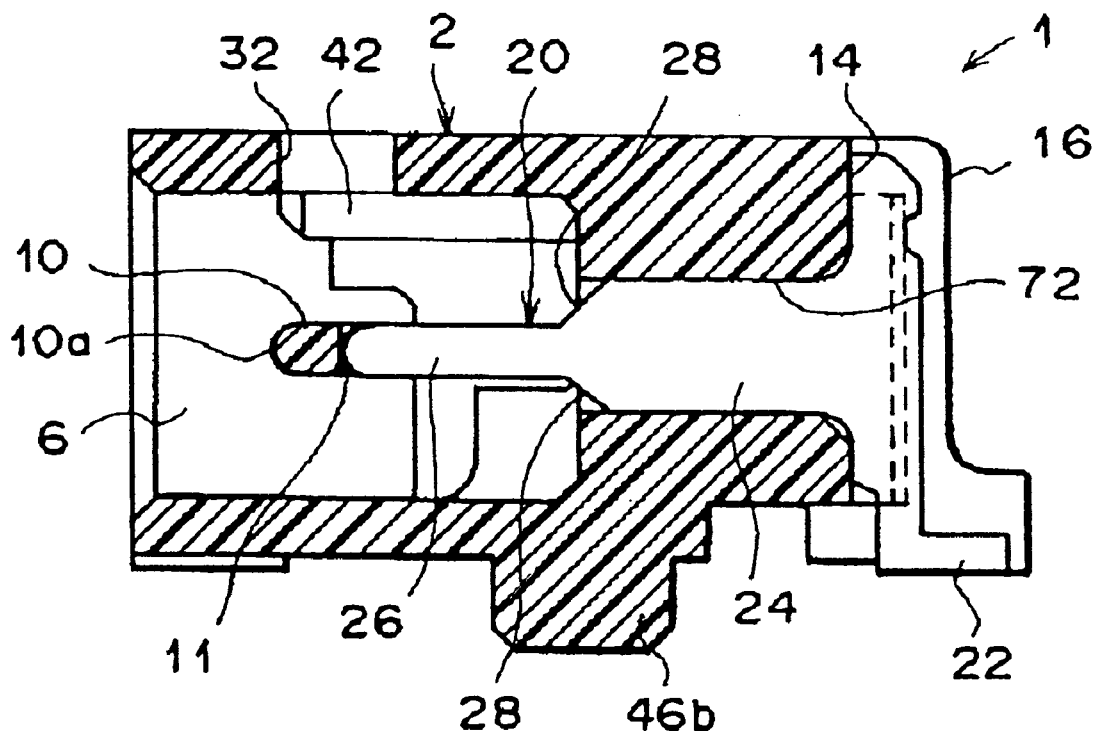
FIG. 5 is a cross-sectional view of the electrical connector of FIG. 2 taken along line 5—5.

The cross-sectional view along line 5—5 in FIG. 2 is shown in FIG. 5. Referring to this cross-sectional view, the shape of the contacts 20 and the state of their installation are explained in detail. Multiple contact insertion holes 72 are formed in the housing 2, at a specified interval in the direction perpendicular to the plane of the paper, toward the front direction from the back end 14. These contact insertion holes 72 are linked to the slot 11 formed in the center rib 10. As shown in FIG. 1 and FIG. 5, the slot 11 extends to near the tips 10a of the center rib 10.

The contacts 20 are sheet-shaped members punch-formed from a single metal sheet, and have a main part 24, a contact part 26, and a tine 22. The contact part 26 extends with narrowing width in the front direction of the main part 24 via an inclined part 28. The width in the vertical direction in the figure of the contact part 26 is somewhat larger than the thickness of the center rib 10. The contacts 20 are inserted by pressure into the contact insertion holes 72 from the back direction of the housing 2, and the main part 24 is engaged with the housing 2 within the contact insertion holes 72 and latched. Here a bump (not shown) provided on the side edge of the main part 24 is engaged with the contact insertion hole 72, so that the contact 20 is latched in an interference fit within the contact insertion hole 72. The contact parts 26 are arranged within the slots 11 formed in the center rib 10. In this fashion, the contact parts 26 are protected by the center rib 10.

At the back end of the main part 24 is integrally formed a tine 22 extending in the vertical direction. The bottom end part of the tine 22 is formed into an L-shape to be soldered to the circuit board 30. The external shape of the contacts 20 should be determined with attention paid to the fact that they are positioned on the inside of the external shape of the protective wall 16. When handling the connector 1, if it is dropped by accident, or if, after installation of the connector 1 on the circuit board 30, an external object collides with the connector 1, there is no contact with the tines 22 of the contacts 20, and the collision is with the protective wall 16, so that the tines 22 are protected.

Figure 6:
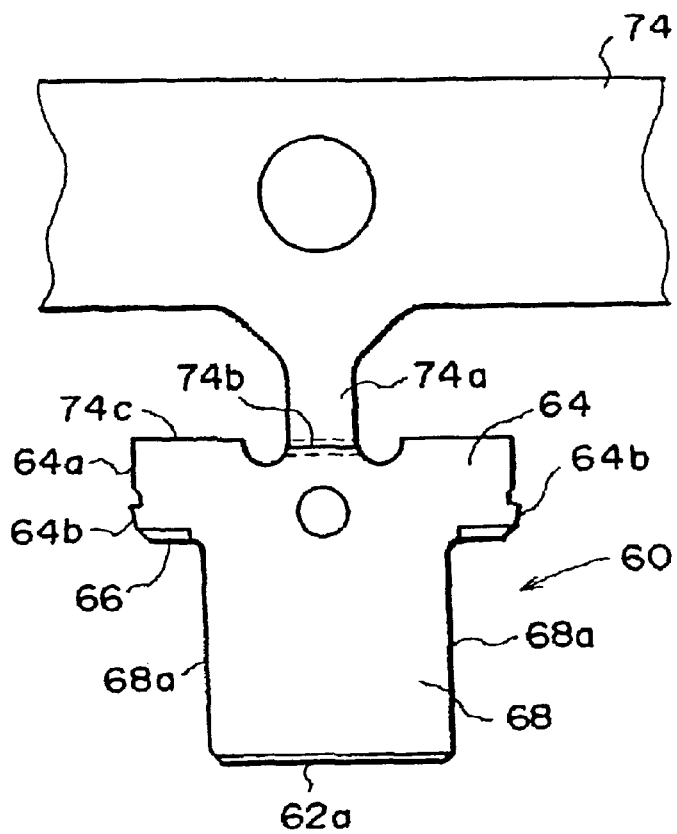
FIG. 6 is a front view of a solder peg used in an electrical connector of the present invention, shown with a carrier strip.

FIG. 6 shows a front view of a solder peg 60 joined with a carrier 74. The solder peg 60 is integrally punch-formed from a metal sheet together with the carrier 74. The solder peg 60 is joined with the carrier 74 via the joining part 74a, but is ultimately cut at the cutting part 74b and separated into an individual piece. The solder peg 60 has a wide pressed part 64 on the top, on which is formed a pressed face 74c extending in the horizontal direction, which passes through a shoulder 66 to be formed into a relatively narrow main part 68.

The side edges 64a of the pressed part 64 extend approximately parallel to the side edges 68a of the main part 68. Bumps 64b are formed on the side edges 64a, and when inserting by pressure into the housing 2, are engaged with the engaging faces 76 of the housing 2, described below, and retained. The tips 62a of the solder pegs 60 become the shear planes when punched, and there exists a slight roughening on the surface.

Figure 7:
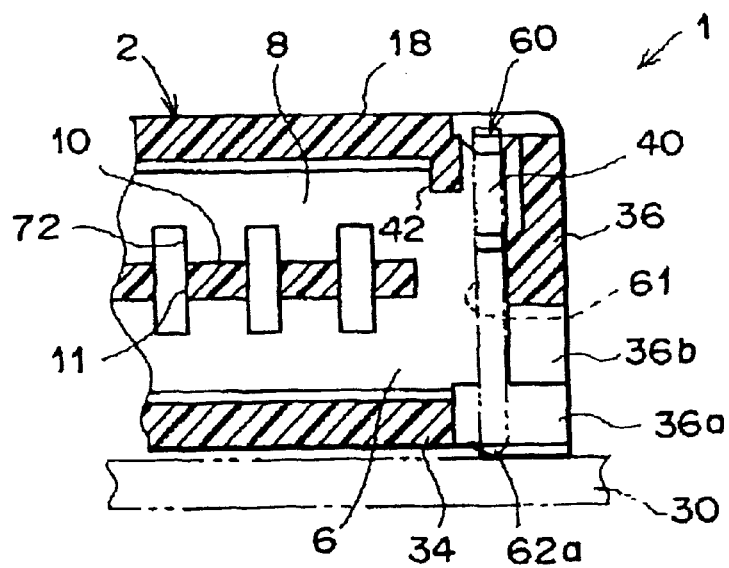
FIG. 7 is a partial cross-sectional view of the electrical connector, sectioned along line 7—7 of FIG. 1.

FIG. 7 shows a partial cross-sectional view of the cross-section along line 7—7 in FIG. 1. However, in this cross-sectional view the state with the contacts 20 removed is shown. The mounting holes 40 extend perpendicular to the bottom wall 34 from the upper wall 18 toward the bottom wall 34 of the housing 2. That is, they extend perpendicular to the circuit board 30. FIG. 7 shows clearly how the bottom part of the mounting holes 40 is linked to the mating aperture 6, and is also open to the outside.

The solder pegs 60 are arranged within the mounting holes 40 as shown by phantom lines. The inner faces 52 (FIG. 1) of the side walls 36 delineating the mating aperture 6 are approximately in the same plane as the face 61 on the side of the mating aperture 6 of the solder pegs 60, and when connectors are mated, the other connector is guided by the inner faces 52 and by this solder peg face 61. Solder peg face 61 of the solder pegs 60 faces the mating aperture 6 of the housing 2, so that it is possible for the solder pegs 60 to make contact with a grounding contact (not shown) of the mating connector to obtain a grounding electrical connection. Further, the solder pegs are exposed to the mating aperture 6 of the housing 2 and to the outside, so that heat from within the housing 2 and from the mating connector can be discharged. In addition, from this drawing it is easily understood that the contact insertion holes 72 and the slot 11 of the center rib 10 are linked.

Figure 8:
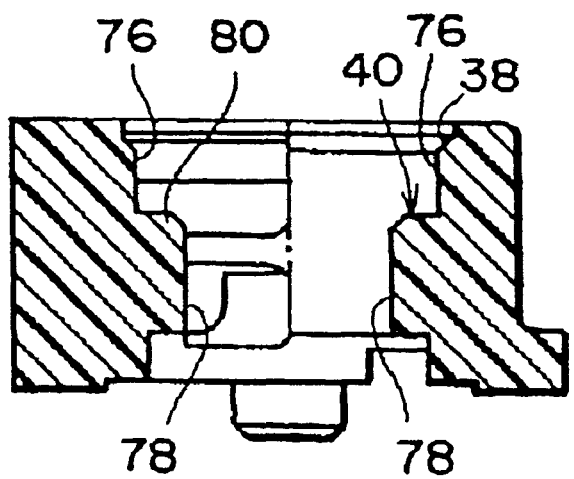
FIG. 8 is a cross-sectional view of the electrical connector along line 8—8 in FIG. 3.
Figure 9:
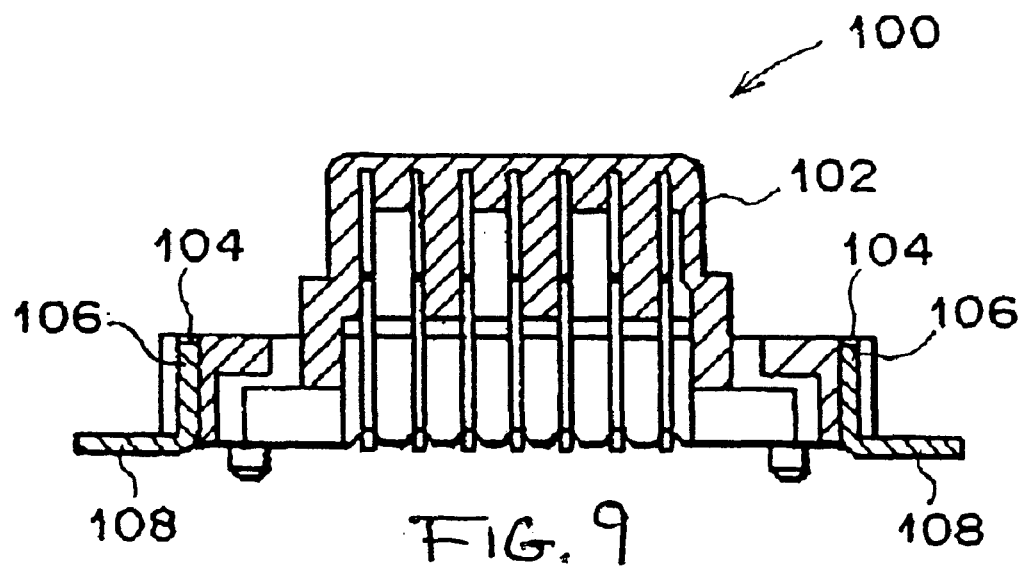
FIG. 9 is a cross-sectional view showing one example of an electrical connector of the prior art.

FIG. 8 shows a cross-sectional view along line 8—8 in FIG. 3, with the side of the circuit board 30 below for convenience. The shapes of the mounting holes 40 formed in the housing 2 and described above are approximately complementary to the external shapes of the solder pegs 60. In other words, a wide engaging face 76 is formed to correspond to the pressed parts 64 of the solder pegs 60, and a narrow face 78 is formed, passing through a step part 80, to correspond to the narrow main part 68.

When the solder pegs 60 are inserted from above into the mounting holes 40 with the main part 68 downward, the main parts 68 are positioned between the faces 78, 78, and moreover the side edges 64a of the pressed parts 64 are positioned at the engaging faces 76, 76. Bumps 64b are formed in the side edges 64a, so that when the pressed faces 74c of the solder pegs 60 are pressed, the bumps 64b are pressed downward while cutting into the engaging faces 76. By this means the solder pegs 60 are latched in the mounting holes 40, with the bumps 64b obstruction-engaged with the engaging faces 76.

An embodiment of the present invention has now been described. However, this embodiment is merely an exemplification, and the invention is not limited to this embodiment. For example, it would be apparent to a person skilled in the art to change the shapes of the solder pegs and the mounting holes according to the shape of the connector, without deviating from the essence of this invention.

The present invention and many of its attendant advantages will be understood from the foregoing description. It is apparent that changes may be made in the form, construction, and arrangement of parts thereof without departing from the spirit of the invention, or sacrificing all of its material advantages. Thus, an embodiment of the invention has been disclosed, it is to be understood that the invention is not strictly limited to this embodiment but may be otherwise variously embodied and practiced within the scope of the following appended claims.

What is claimed is:

1. An electrical connector comprising:
    a housing having mounting holes on opposite sides of the housing proximate side walls of the housing, the mounting holes extend from a first wall to a second circuit board receiving wall;
    a plurality of contacts mounted in the housing;
    planar solder pegs inserted into the mounting holes through the first wall and mounted in the mounting holes such that soldering tips of the solder pegs extend beyond the second circuit board receiving wall, whereby as the electrical connector is mounted to a circuit board, the soldering tips engage the circuit board and are soldered thereto to secure the electrical connector to the circuit board; and
    an opening is provided on each respective side wall of the housing, the openings extend from the side walls to the mounting holes and are positioned proximate to the second circuit board receiving wall, the openings are dimensioned to have a width which is larger than the width of the soldering tips to allow visual inspection, repair or removal of the solder provided between the soldering tips and the circuit board, such that the planar solder peg can be removed from the housing.

2. The electrical connector of claim 1, wherein the housing further comprises a mating aperture for receiving a mating electrical connector and the mounting holes are linked with the mating aperture whereby a side of each solder peg is exposed to the mating aperture and provides a ground connection for the mating connector receivable in the mating aperture.

3. An electrical connector as recited in claim 1 wherein mounting bumps and the soldering tip of each respective planar solder peg are positioned in the same plane thereby minimizing the space required for the solder pegs in the electrical connector and reducing the circuit board space required for mounting the electrical connector thereon.

4. An electrical connector as recited in claim 1 wherein chamfers are around the mounting holes on the first surface of the electrical connector, whereby the chamfers facilitate the insertion of the solder pegs through the first wall and into the mounting holes.

5. An electrical connector comprising:
    a housing having a plurality of contacts disposed within a mating aperture;
    mounting holes provided on opposite sides of the housing proximate side walls of the housing, the mounting holes extend from a first wall to a second circuit board receiving wall;
    planar solder pegs inserted into the mounting holes through the first wall, the solder pegs disposed in the mounting holes in the housing for soldering the electrical connector to a circuit board, the mounting holes being located on either side of the mating aperture, and a side of each solder peg being exposed to the mating aperture and providing a ground connection for a mating connector receivable in the mating aperture;
    an opening is provided on each respective side wall of the housing, the openings extend from the side walls to the mounting holes and are positioned proximate to the second circuit board receiving wall, the openings are dimensioned to have a width which is larger than the width of the soldering tips to allow visual inspection, repair or removal of the solder provided between the soldering tips and the circuit board, such that the planar solder peg can be removed from the housing.

\* \* \* \* \*